United States Patent

[11] 3,624,426

[72] Inventor Veikko Reynold Saari
Matawan Township, Monmouth County, N.J.

[21] Appl. No. 77,815
[22] Filed Oct. 5, 1970
[45] Patented Nov. 30, 1971
[73] Assignee Bell Telephone Laboratories, Incorporated
Murray Hill, N.J.

[54] CURRENT SOURCE FOR SEMICONDUCTOR CIRCUITS
6 Claims, 4 Drawing Figs.

[52] U.S. Cl. .......... 307/297,
307/270, 323/8, 330/28
[51] Int. Cl. .......... G05f 1/10
[50] Field of Search .......... 323/8;
307/270, 297; 330/28

[56] References Cited

UNITED STATES PATENTS

| | | | |
|---|---|---|---|
| 3,509,364 | 4/1970 | Buckley | 307/270 |
| 3,457,493 | 7/1969 | Shoemaker | 323/4 |

*Primary Examiner*—Donald D. Forrer
*Assistant Examiner*—Harold A. Dixon
*Attorneys*—R. J. Guenther and E. W. Adams, Jr.

ABSTRACT: A positive current source for use in NPN majority monolithic integrated circuit technology has PNP transistors with low gains. A constant current is generated by connecting the bases and emitters of two of these PNP transistors together. The current at the output collector of the first PNP transistor is controlled by using high-gain NPN transistors to divert the large base currents of these PNP transistors from the resistance in the collector of the second PNP transistor while coupling the voltage across this resistance to the bases of both PNP transistors.

INVENTOR
V. R. SAARI
BY David P. Kelley
ATTORNEY

CURRENT SOURCE FOR SEMICONDUCTOR CIRCUITS

BACKGROUND OF THE INVENTION

This invention relates to current sources and, more particularly, to positive current sources for NPN majority monolithic integrated circuits.

Integrated circuits are usually designed to use only PNP- or NPN-transistors. This is done to simplify the processing steps and thereby reduce the cost of manufacturing. When one type of transistor is used, the integrated circuit can be optimized for that particular type. If transistors of the opposite type are also formed in this type of integrated circuit they usually have very low gains, in some cases less than unity. These transistors can be used only where a low gain will not affect performance.

In most circuit designs PNP-transistors are used to create positive sources of current. A typical circuit of this type is disclosed in U.S. Pat. No. 3,185,858 of O. H. Flatten, issued on May 25, 1965. The Flatten patent shows the use of two PNP-transistors to form a current source. One of the transistors acts to control the current in the other transistor. This control is maintained because of the high gain of the transistor which produces a substantially flat $V_{CB}$ - $I_C$ characteristic.

Other prior art circuits depend on the fact that high-gain PNP-transistor have small base currents. Because of the small base currents, the base electrodes of these transistors can be connected to the control resistance without upsetting the control voltage. However, as stated in the foregoing, this type of transistor is not available in most NPN majority monolithic integrated circuits.

It is, therefore, an object of this invention to overcome the necessity for high-gain PNP-transistors in NPN majority monolithic integrated circuits.

SUMMARY OF THE INVENTION

The present invention is directed toward reducing the problem of creating a positive current source in NPN majority monolithic integrated circuits by using high-gain NPN-transistors to divert the large base currents from the control resistance while coupling the control voltage to the bases of the PNP-transistors.

In an illustrative embodiment of the invention, two PNP-transistors have their emitters connected to a positive voltage source and their bases connected together. The collector of the first PNP-transistor is used as the output of the circuit and the collector of the second transistor is connected through a control resistance to ground. The bases of the two PNP-transistor are connected to the base of an NPN-transistor which has its collector connected to its base. The emitter of this first NPN-transistor is connected to the emitter of a second NPN-transistor and through a second resistance to ground. The collector of the second NPN-transistor is connected to a second positive voltage source and its base is connected to the control resistance. Since the base and emitter of the two PNP-transistors are tied together they have substantially the same collector current. The collector current is established by coupling the voltage across the control resistance through the two NPN-transistors to the bases of the two PNP-transistors. In this circuit the large base currents of the PNP-transistors flow through the first PNP-transistor and the second resistance to ground. Therefore, the control resistance is not affected by the fact that the PNP-transistor have low gains.

The foregoing and other features of the present invention will be more readily apparent from the following detailed description and drawings.

DETAILED DESCRIPTION

Figure 1:
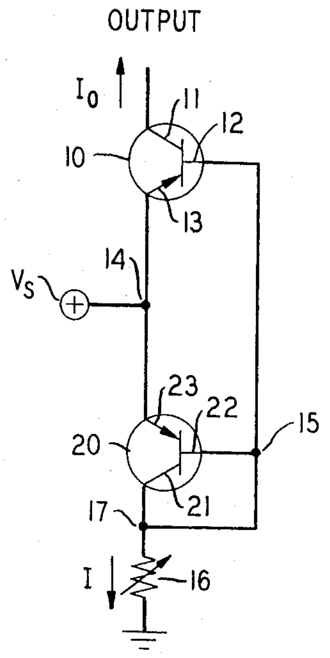
FIG. 1 PRIOR ART
FIG. 1 is a block diagram of a prior art positive current source.

The arrangement of FIG. 1 is a typical prior art positive current source. In this arrangement the emitter electrodes 13 and 23 of transistors 10 and 20, respectively, are connected to terminal 14. A positive voltage source is also connected to terminal 14. The bases 12 and 22 of transistors 10 and 20, respectively, are connected to terminal 15. The collector 11 of transistor 10 is connected to the output of the circuit and the collector 21 of transistor 20 is connected to terminal 17. Terminal 15 is connected to terminal 17 and a control resistance 16 is connected between terminal 17 and ground. Because the bases and the emitters of the two transistors are connected together, the collector currents of the two nearly identical transistors are substantially the same. Since the base and collector of transistor 20 are connected together, this transistor acts as a diode. Therefore, the current through resistance 16 is nearly equal to $$I = V_s - V_{BE}/R_{16} \qquad (1)$$

where $V_S$ is the value of the positive voltage source and $V_{BE}$ is the base-emitter voltage of transistor 22. Since the two transistors have high gains, nearly all of this current will be the collector current of transistor 20. Because the bases and the emitters of the two transistors are connected together, the output current $I_O$ will nearly equal the control resistance current $I$.

Figure 2:
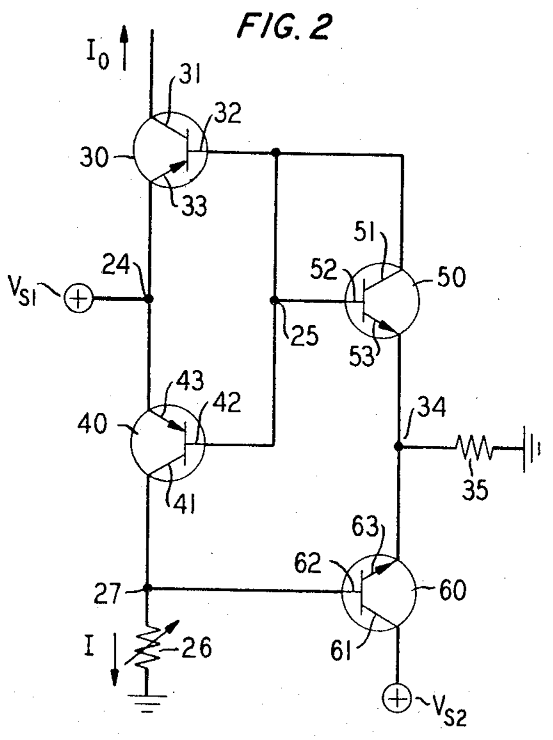
FIG. 2 is an illustrative embodiment of the invention.

FIG. 2 is an illustrative embodiment of the present invention using low-gain PNP-transistors. The emitter electrodes 33 and 43 of PNP-transistors 30 and 40, respectively, are connected to terminal 24. A positive voltage source, $V_{S1}$, is also connected to terminal 24. The bases 32 and 42 of transistors 30 and 40, respectively, are connected to terminal 25. The collector 31 of transistor 30 is connected to the output of the circuit and the collector 41 of transistor 40 is connected to terminal 27. Resistance 26 is connected between terminal 27 and ground. To control the current output of the circuit the control voltage developed across resistance 26 must be applied to the bases of the PNP-transistors at terminal 25. However, since the PNP-transistors of FIG. 2 have low gain, their relatively large base currents would upset the control voltage. In order to draw off the base current while still providing a path from terminal 25 to terminal 27, NPN-transistors 50 and 60 are provided. Terminal 25 is connected to base 52 and collector 51 of transistor 50. Emitter 53 of transistor 50 is connected to terminal 34. Terminal 34 is connected to one side of resistance 35 and to emitter 63 of transistor 60. The other side of resistance 35 is connected to ground. Collector 61 of transistor 60 is connected to a second positive voltage source, $V_{S2}$, and base 62 of transistor 60 is connected to terminal 27. When the circuit is first turned ON an increasing current flows through transistor 40 and resistance 26. This produces an increasing voltage at terminal 27. The voltage at terminal 27 is coupled to terminal 25 through the base-emitter junctions of transistors 50 and 60. This control voltage increases until it comes within a normal base-emitter voltage level of the first voltage source, $V_{S1}$. When this happens, the circuit stabilizes, producing a constant current output. The large base currents of transistors 30 and 40 flow through the transistor 50 and resistance 35 to ground. In this way a positive current source is formed, using low-gain PNP-transistors.

Figure 3:
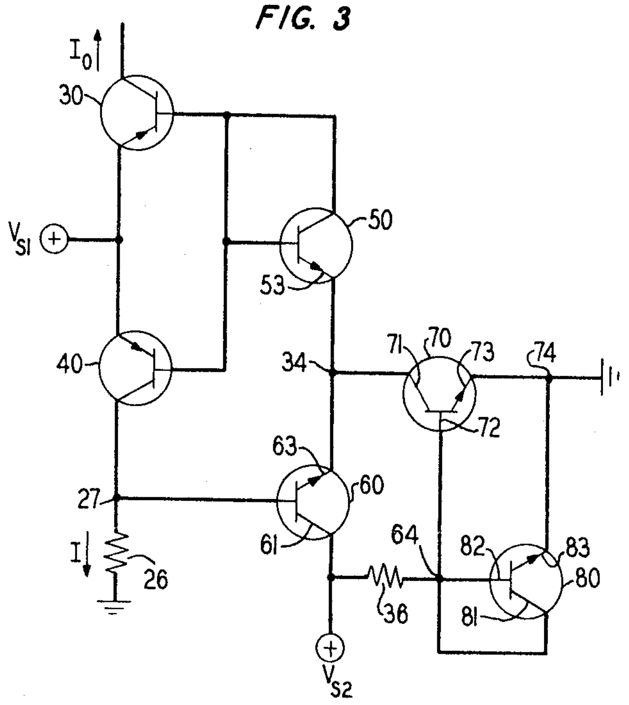
FIG. 3 is an illustrative embodiment of the invention with a prior art current source used to bias the circuit; and sharing

FIG. 3 is a modification of the arrangement of FIG. 2 where resistance 35 is replaced with a conventional negative constant current source similar to that shown in FIG. 1. The conventional negative constant current source is made up of transistors 70 and 80 and resistance 36. The collector 71 of transistor 70 is connected to terminal 34. The emitters 73 and 83 of transistors 70 and 80, respectively, are connected to ground. The bases 72 and 82 of transistors 70 and 80, respectively, are connected to terminal 64. Collector 81 of transistor 80 and one end of resistance 36 are also connected to terminal 64. The other end of resistance 36 is connected to collector 61 of transistor 60. With the replacement of resistance 35 with this negative current source, the positive current source can operate over a wider range of $V_{S1}$ voltages since a constant current is drawn through the emitters of transistors 50 and 60, substantially independent of the voltage at terminal 34.

Figure 4:
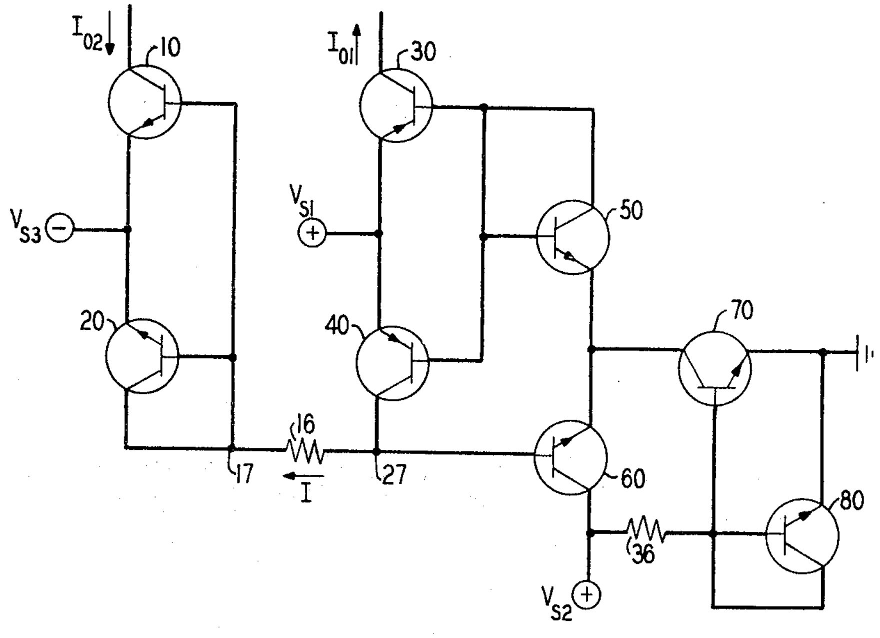
FIG 4 is an illustrative embodiment of the invention sharing a common control resistance with a prior art current source.

FIG. 4 shows the circuit of FIG. 3 connected to a prior art circuit similar to that shown in FIG. 1 in order to form a dual current supply in which the output currents are locked in a fixed ratio. Both circuits share a common control resistance, 16. Since the prior art portion of FIG. 4 uses NPN-transistors it functions as a negative current source. The current through control resistance 16 is equal to $$I = V_{S1} + V_{S3} - 2V_{BE}/R_{16} \qquad (2)$$

where $V_{S1}$ is the first positive voltage source, $V_{S3}$ is the negative voltage source, $V_{BE}$ is the base-emitter voltages of transistors 20 and 40 which are assumed to be the same, and $R_{16}$ is resistor 16. Since the output currents of both circuits are determined by the current through the control resistance, the two output currents are locked together in a fixed ratio. If the emitter area of transistor 10 is twice that of transistor 20, the ratio will be 2:1. The ratio of output currents in this circuit will be maintained regardless of changes in supply voltage or the control resistance.

This invention provides a circuit for providing a source of positive current in an NPN majority monolithic integrated circuit which has been optimized for NPN-transistors, overcoming the problem of low gain in the PNP-transistors. The circuit can also be used in combination with a negative current source to provide a dual current source whose output currents are locked together in a fixed ratio. This invention would work equally well for a negative current source in a PNP majority monolithic integrated circuit and although a specific embodiment of this invention has been shown and described, it will be understood that various modifications may be made without departing from the spirit of this invention.

I claim:

1. A current source comprising:
   - a first low-gain transistor having its collector connected to an output terminal and its emitter connected to a first voltage source,
   - a second low-gain transistor having its emitter connected to the emitter of said first low-gain transistor and its base connected to the base of said first low-gain transistor,
   - a first resistance having one end connected to the collector of said second low-gain transistor and the other end to a point of reference potential,
   - a first high-gain transistor having its collector connected to its base and its base connected to the base of said first low-gain transistor,
   - a second high-gain transistor having its collector connected to a second voltage source, its base connected to the collector of said second low-gain transistor, and its emitter connected to the emitter of said first high-gain transistor,
   - and means for directing the emitter current of said first high-gain transistor to ground.

2. A circuit as claimed in claim 1 in which said high-gain transistors are of the NPN type and said low-gain transistors are of the PNP type, thereby creating a source of positive current at the output.

3. A circuit as claimed in claim 1 in which the means for directing the emitter current of said first high-gain transistor is a second resistance.

4. A circuit as claimed in claim 1 in which the means for directing the emitter current of said first high-gain transistor is a negative current source comprising:
   - a third NPN high-gain transistor having its collector connected to the emitter of said first high-gain transistor and its emitter connected to ground,
   - a fourth NPN high-gain transistor having its collector connected to its base, its base connected to the base of said third NPN-transistor, and its emitter connected to ground,
   - and a collector resistance having one end connected to the base of said fourth NPN-transistor and the other end to the collector of said second NPN-transistor.

5. A circuit as claimed in claim 1 and further including a circuit between the first resistance and the reference potential having a second output terminal, said circuit comprising:
   - a pair of high-gain transistors, one of said transistors having its collector and base connected to said first resistance, and its emitter connected to said reference potential, and
   - the other of said transistors having its emitter connected to said reference potential, its base connected to the base of said one transistor and its collector connected to said second output terminal, thereby creating a dual source of current in which the current output of said second output terminal is locked to the current output of said first output terminal in a substantially fixed ratio.

6. A circuit as claimed in claim 5 in which the pair of high-gain transistors are of the NPN type, the low-gain transistors are of the PNP type, and the reference potential is negative, thereby creating a source of positive current at said first output terminal and a source of negative current at said second output terminal which is locked in a substantially fixed ratio to the current at said first terminal.

* * * * *